US012765318B2

(12) United States Patent
Taoda

(10) Patent No.: US 12,765,318 B2
(45) Date of Patent: Oct. 13, 2026

(54) SUBSTRATE TRANSFER SYSTEM AND IMAGE CORRECTION METHOD

(71) Applicant: Tokyo Electron Limited, Tokyo (JP)

(72) Inventor: Isamu Taoda, Nirasaki City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 316 days.

(21) Appl. No.: 18/372,767

(22) Filed: Sep. 26, 2023

(65) Prior Publication Data

US 2024/0105487 A1 Mar. 28, 2024

(30) Foreign Application Priority Data

Sep. 27, 2022 (JP) ................................. 2022-153878

(51) Int. Cl.

| | |
|---|---|
| ***H10P 72/50*** | (2026.01) |
| ***G06T 5/80*** | (2024.01) |
| ***G06T 7/00*** | (2017.01) |
| ***G06T 7/73*** | (2017.01) |
| ***H10P 72/76*** | (2026.01) |

(52) U.S. Cl.

CPC ................ *H10P 72/53* (2026.01); *G06T 5/80* (2024.01); *G06T 7/001* (2013.01); *G06T 7/73* (2017.01); *H10P 72/7602* (2026.01); *G06T 2207/30108* (2013.01)

(58) Field of Classification Search

CPC .......... H10P 72/50; H10P 72/53; H10P 72/76; H10P 72/7602; H10P 72/00; H10P 72/0606; H10P 72/0616; H10P 72/0604; H10P 72/30; H10P 72/3302; H10P 72/3402; G06T 5/80; G06T 7/00; G06T 7/001; G06T 7/73; G06T 2207/30108; G01B 11/06; G01B 11/0616; G01N 21/94

See application file for complete search history.

(56) References Cited

U.S. PATENT DOCUMENTS 7,957,829 B2 * 6/2011 Jonas ...................... H10P 72/53 700/121
8,687,101 B2 * 4/2014 Hirota ................... H10F 39/807 257/292

(Continued)

FOREIGN PATENT DOCUMENTS

CN 109554662 B * 4/2020 ............. C23C 14/50
CN 112888913 A * 6/2021 ............. H04N 25/71

(Continued)

*Primary Examiner* — Stephen R Koziol
*Assistant Examiner* — Benedict E Lee
(74) *Attorney, Agent, or Firm* — Nath, Goldberg & Meyer; Jerald L. Meyer

(57) ABSTRACT

A substrate transfer system includes: a transfer device provided with a substrate holder configured to hold a substrate; a lower line camera provided in a transfer path of the substrate to capture an image of a rear surface of the substrate which is being transferred and an image of the substrate holder; an upper line camera provided in the transfer path of the substrate to capture an image of a front surface of the substrate which is being transferred; and a controller that generates a rear-surface image based on the image captured by the lower line camera and generates a front-surface image based on the image captured by the upper line camera.

13 Claims, 7 Drawing Sheets

(56) References Cited

U.S. PATENT DOCUMENTS

| | | | | |
|---|---|---|---|---|
| 2003/0206794 | A1 * | 11/2003 | Konig | H10P 72/50 414/757 |
| 2012/0315113 | A1 * | 12/2012 | Hiroki | B65G 49/061 414/217 |

FOREIGN PATENT DOCUMENTS

| | | | | | |
|---|---|---|---|---|---|
| CN | 111624206 | B | * | 8/2021 | G01N 21/8806 |
| DE | 10028569 | A1 | * | 12/2001 | G01N 21/9501 |
| JP | 2006258486 | A | * | 9/2006 | |
| JP | 2006-301301 | A | | 11/2006 | |
| JP | 2008064595 | A | | 3/2008 | |
| JP | 2014139550 | A | * | 7/2014 | |
| JP | 2021018131 | A | * | 2/2021 | |
| KR | 102298108 | B1 | * | 9/2021 | G01N 21/94 |
| KR | 1020220037353 | A | | 3/2022 | |
| KR | 1020220064925 | A | | 5/2022 | |
| TW | 200834788 | A | * | 8/2008 | H10P 72/3402 |
| TW | 201219121 | A | * | 5/2012 | H10P 72/3302 |
| WO | WO-2020061882 | A1 | * | 4/2020 | G01B 11/06 |

* cited by examiner

SUBSTRATE TRANSFER SYSTEM AND IMAGE CORRECTION METHOD

CROSS-REFERENCE TO RELATED APPLICATION

This application is based upon and claims the benefit of priority from Japanese Patent Application No. 2022-153878, filed on Sep. 27, 2022, the entire contents of which are incorporated herein by reference.

TECHNICAL FIELD

The present disclosure relates to a substrate transfer system and an image correction method.

BACKGROUND

Patent Document 1 discloses a substrate inspection apparatus including a line camera for capturing an image of a lower surface of a substrate.

PRIOR ART DOCUMENT

Patent Document

Patent Document 1: Japanese Laid-Open Patent Publication No. 2014-139550

SUMMARY

According to one embodiment of the present disclosure, there is provided a substrate transfer system includes: a transfer device provided with a substrate holder configured to hold a substrate; a lower line camera provided in a transfer path of the substrate to capture an image of a rear surface of the substrate which is being transferred and an image of the substrate holder; an upper line camera provided in the transfer path of the substrate to capture an image of a front surface of the substrate which is being transferred; and a controller that generates a rear-surface image based on the image captured by the lower line camera and generates a front-surface image based on the image captured by the upper line camera.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
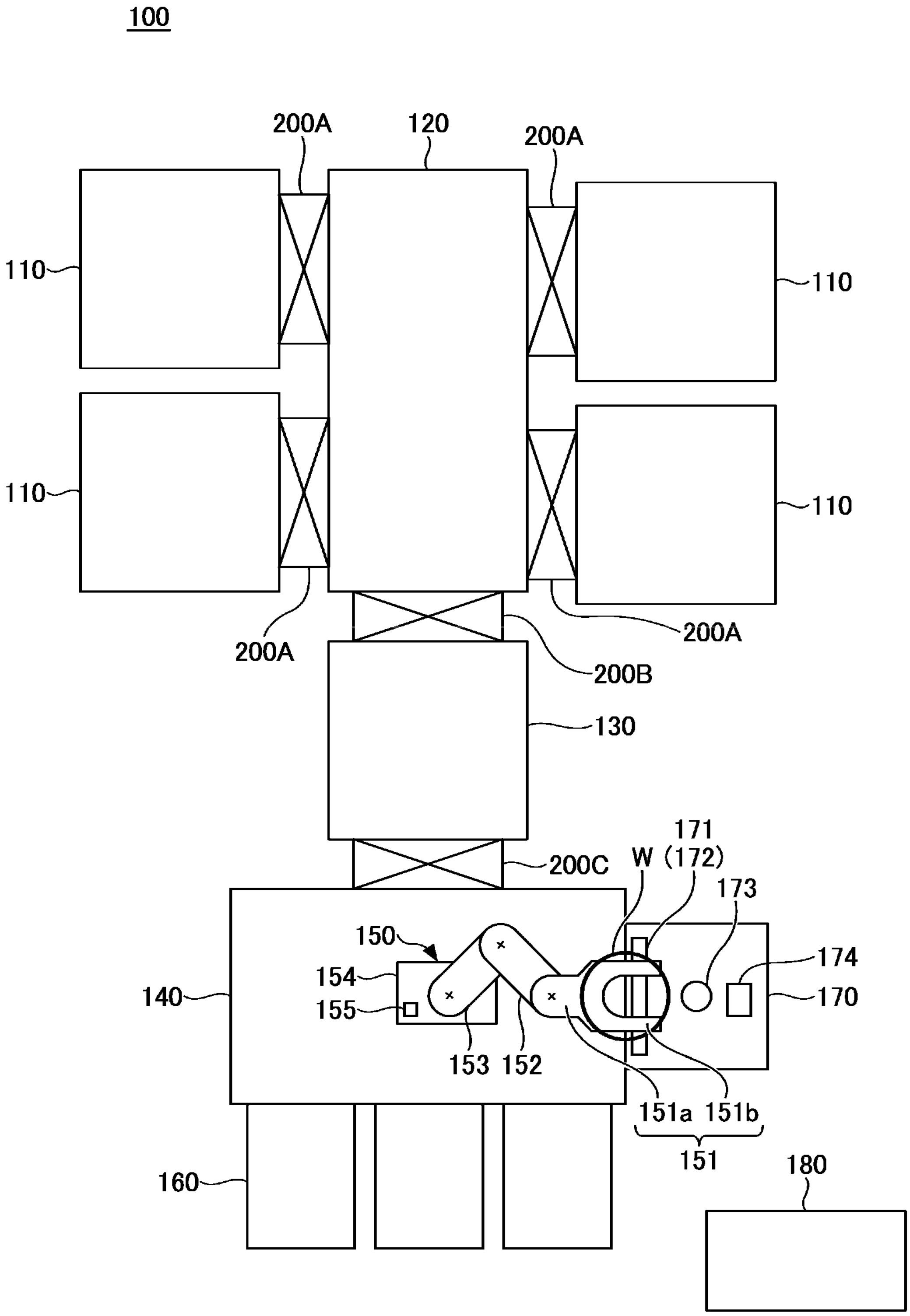
FIG. 1 is an example schematic view illustrating a configuration of a substrate transfer system according to one embodiment.

Hereinafter, embodiments for carrying out the present disclosure will be described with reference to the drawings. In each drawing, the same reference numerals may be given to the same components, and redundant descriptions thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Transfer System 100>

An example of an overall configuration of a substrate transfer system 100 according to one embodiment will be described with reference to FIG. 1. FIG. 1 is a schematic view illustrating an example of the configuration of the substrate transfer system 100 according to one embodiment.

The substrate transfer system 100 illustrated in FIG. 1 is a cluster-structured (or multi-chamber type of) system. The substrate transfer system 100 includes a plurality of processing chambers 110, a vacuum-side transfer chamber 120, a load lock chamber 130, an atmospheric-side transfer chamber 140, load ports 160, an aligner module 170, and a controller 180. Further, the substrate transfer system 100 includes gate valves 200A, a gate valve 200B, and a door valve 200C.

Each processing chamber 110 is coupled to the vacuum-side transfer chamber 120 via the gate valve 200A. The processing chamber 110 and the vacuum-side transfer chamber 120 communicate with each other by the opening and closing of the gate valve 200A.

The processing chamber 110 includes a stage (not illustrated) on which a substrate W is placed. The interior of the processing chamber 110 is depressurized to a predetermined vacuum atmosphere. The processing chamber 110 performs desired processing (e.g., etching, film formation, cleaning, and ashing or the like) on the substrate W placed on the stage in the interior of the processing chamber 110. For example, the processing chamber 110 may be a processing chamber in which plasma is generated in the interior thereof to perform the desired processing on the substrate W. Further, the processing chamber 110 may be a processing chamber in which the substrate W is heated to a desired temperature to be subjected to the desired processing.

The vacuum-side transfer chamber 120 is connected to a plurality of chambers (the processing chambers 110 and the load lock chamber 130) via the gate valves 200A and 200B.

The interior of the vacuum-side transfer chamber 120 is depressurized to a predetermined vacuum atmosphere. Further, the vacuum-side transfer chamber 120 includes a vacuum transfer device (not illustrated) that transfers the substrate W. The vacuum transfer device performs the loading and unloading of the substrate W between each processing chamber 110 and the vacuum-side transfer chamber 120 with the opening and closing of each gate valve 200A. Further, the vacuum transfer device performs the loading and unloading of the substrate W between the load lock chamber 130 and the vacuum-side transfer chamber 120 with the opening and closing of the gate valve 200B. In addition, the operation of the vacuum transfer device and the opening and closing of the gate valves 200A and 200B are controlled by the controller 180.

The load lock chamber 130 is provided between the vacuum-side transfer chamber 120 and the atmospheric-side transfer chamber 140. That is, the load lock chamber 130 is connected to the vacuum-side transfer chamber 120 via the gate valve 200B. Further, the load lock chamber 130 is connected to the atmospheric-side transfer chamber 140 via the door valve 200C.

The load lock chamber 130 includes a stage (not illustrated) on which the substrate W is placed. The interior of the load lock chamber 130 is configured to be switched between an ambient environment and a vacuum atmosphere. The load lock chamber 130 communicates with the vacuum-side transfer chamber 120 kept in the vacuum atmosphere, by the opening and closing of the gate valve 200B. The load lock chamber 130 communicates with the atmospheric-side transfer chamber 140 kept in the ambient environment, by the opening and closing of the door valve 200C. In addition, the switching of the interior of the load lock chamber 130 into the vacuum atmosphere or the ambient environment is controlled by the controller 180.

The interior of the atmospheric-side transfer chamber 140 is kept in the ambient environment so that, for example, a down-flow of clean air is formed. Further, the atmospheric-side transfer chamber 140 includes an atmospheric-side transfer device 150 that transfers the substrate W. The atmospheric-side transfer device 150 performs the loading and unloading of the substrate W between the load lock chamber 130 and the atmospheric-side transfer chamber 140 with the opening and closing of the door valve 200C. In addition, the atmospheric-side transfer device 150 performs the loading and unloading of the substrate W between the atmospheric-side transfer chamber 140 and a carrier attached to each load port 160. Further, the atmospheric-side transfer device 150 performs the loading and unloading of the substrate W between the atmospheric-side transfer chamber 140 and the aligner module 170. In addition, the operation of the atmospheric-side transfer device 150 and the opening and closing of the door valve 200C are controlled by the controller 180.

The atmospheric-side transfer device 150 includes a multi-joint robot (SCARA robot), which is provided with a fork (also referred to as a pick, end effector, or substrate holder) 151 that holds the substrate W, and arms 152 and 153. The fork 151 has a base portion 151*a* and an extension portion 151*b* that extends from the base portion 151*a*.

A plurality of (e.g., two in an example of FIG. 1 and the like) extension portions 151*b* are provided in parallel. Further, the extension portions 151*b* are arranged at positions spaced apart from the center of the substrate W supported by the fork 151. Thus, the fork 151 is formed to support the substrate W without interfering with a central portion of the substrate W. Further, the fork 151 illustrated in FIG. 1 has two extension portions 151*b* extending in a transfer direction. One of the two extension portions 151*b* has a linear portion 151*b*1 at an edge thereof toward the central portion of the substrate W (see FIGS. 3 and 4). The other of the two extension portions 151*b* has a linear portion 151*b*2 at an edge thereof toward the central portion of the substrate W (see FIGS. 3 and 4).

The base portion 151*a* is rotatably supported by one end of the arm 152. The other end of the arm 152 is rotatably supported by one end of the arm 153. The other end of the arm 153 is rotatably supported by a base 154. The base 154 includes a lifting mechanism that moves the multi-joint robot up and down. Thus, the multi-joint robot may control a horizontal position, an orientation, and a height position of the fork 151 that holds the substrate W. The atmospheric-side transfer device 150 includes a sensor (motion detector) 155 that detects a motion of the fork 151. The sensor 155 detects, for example, an angle of each joint of the multi-joint robot. The sensor 155 may be, for example, an encoder provided in a motor that drives the joint. Thus, the controller 180 may calculate the motion of the fork 151 based on the angle of each joint detected by the sensor 155. In other words, the controller 180 may calculate, based on the angle of each joint detected by the sensor 155, a reference position of the substrate W which is being transferred by the multi-joint robot (e.g., the central position of the substrate W). Further, the controller 180 may calculate, based on the angle of each joint detected by the sensor 155, a transfer trajectory of the reference position of the substrate W which is being transferred by the multi-joint robot.

Further, the load port 160 is provided on one wall surface of the atmospheric-side transfer chamber 140. A carrier that accommodates the substrate W therein or an empty carrier is attached to the load port 160. For example, a front opening unified pod (FOUP) may be used as the carrier.

Further, the aligner module 170 is provided on another wall surface of the atmospheric-side transfer chamber 140. In addition, the aligner module 170 will be described later with reference to FIGS. 2 to 4.

The atmospheric-side transfer device 150 may pick up the substrate W accommodated in the carrier, which is attached to the load port 160, and may place the same on a pedestal 173 of the aligner module 170. Further, the atmospheric-side transfer device 150 may pick up the substrate W placed on the pedestal 173 of the aligner module 170, and may place the same on the stage of the load lock chamber 130. Further, the atmospheric-side transfer device 150 may pick up the substrate W placed on the stage of the load lock chamber 130, and may accommodate the same in the carrier attached to the load port 160.

The controller 180 includes a central processing unit (CPU), a read only memory (ROM), a random access memory (RAM), and a hard disk drive (HDD). The controller 180 is not limited to the HDD and may include other storage areas such as a solid state drive (SSD). Recipes in which process procedures, process conditions, and transfer conditions are set are stored in the storage areas such as the HDD and RAM.

The CPU controls the processing of the substrate W in each processing chamber 110 based on the recipes, and controls the transfer of the substrate W. The HDD or RAM may store programs for executing the processing of the substrate W in each processing chamber 110 or the transfer of the substrate W. The programs may be provided while being stored in a computer readable storage medium, or may be provided from an external device via a network.

<Aligner Module 170>

Figure 2:
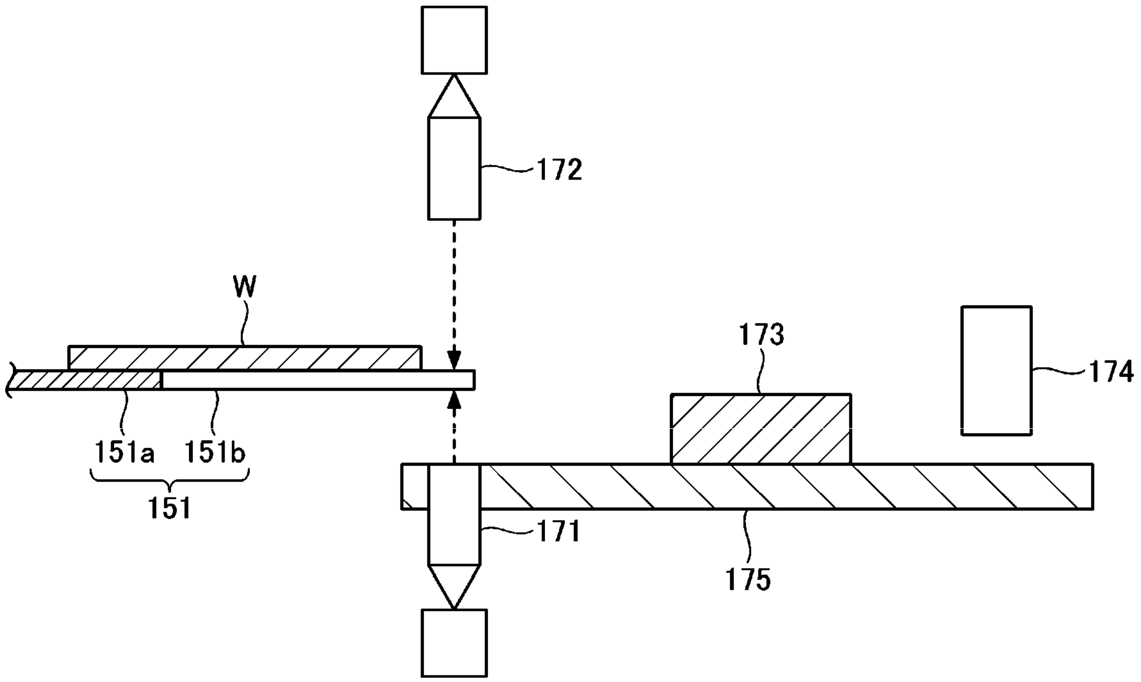
FIG. 2 is a schematic cross-sectional view illustrating an example of an aligner module.
Figure 3:
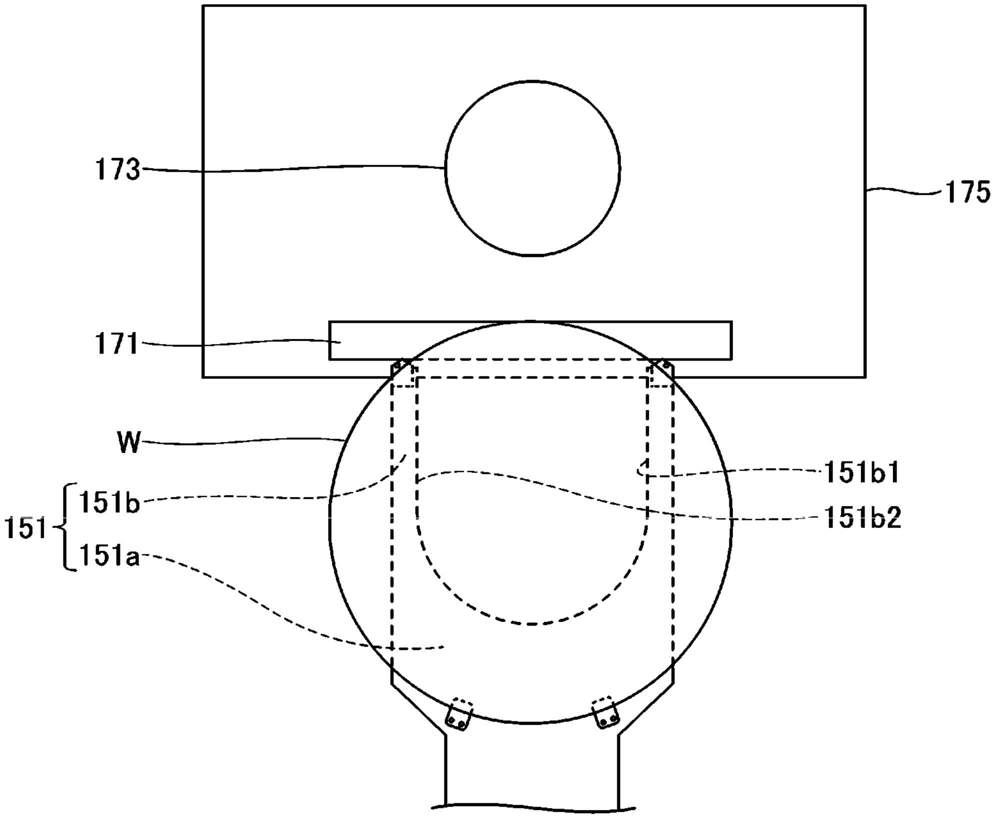
FIG. 3 is a schematic view illustrating an example of the aligner module as viewed from above.
Figure 4:
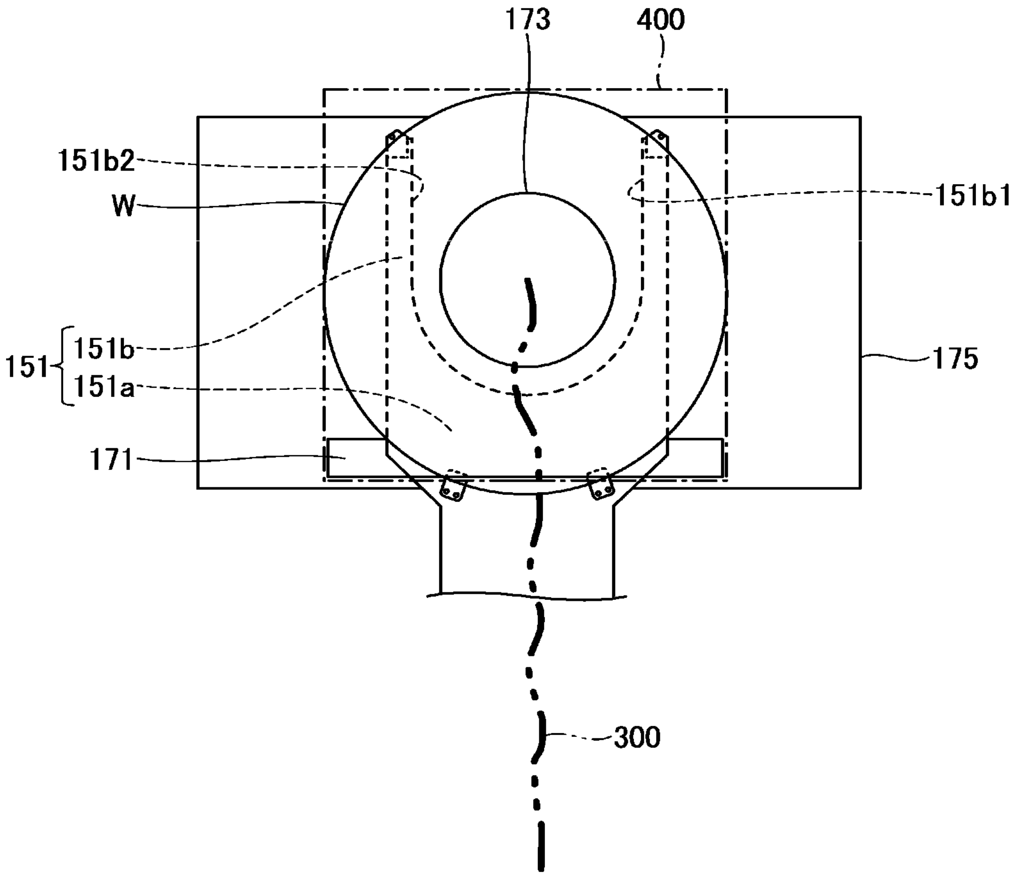
FIG. 4 is a schematic view illustrating an example of the aligner module as viewed from above.

Next, a configuration of the aligner module 170 will be described with reference to FIGS. 2 to 4. FIG. 2 is a schematic cross-sectional view illustrating an example of the aligner module 170. FIGS. 3 and 4 are schematic views illustrating examples of the aligner module 170 as viewed from above. FIG. 3 illustrates a state where the substrate W being transferred begins to enter between a lower line camera 171 and an upper line camera 172. FIG. 4 illustrates a state where the substrate W is further transferred and has reached at a position of the pedestal 173. In addition, in FIGS. 3 and 4, the illustration of the upper line camera 172 and an alignment sensor 174 arranged above the substrate W is omitted.

The aligner module 170 includes the lower line camera 171, the upper line camera 172, the pedestal 173 that is configured to be rotatable, the alignment sensor 174, and a base plate 175.

The lower line camera 171 and the upper line camera 172 are provided in a transfer path along which the substrate W is transferred from the atmospheric-side transfer chamber 140 to the pedestal 173 of the aligner module 170. The lower line camera 171 and the upper line camera 172 include a plurality of capturing elements arranged in a widthwise direction crossing (e.g., perpendicular to) the transfer direction of the substrate W (a traveling direction of the fork 151), and a light source. As the substrate W is transferred along the transfer path, the lower line camera 171 captures an image of a rear surface of the substrate W and a rear surface of the fork 151. Further, as the substrate W is transferred along the transfer path, the upper line camera 172 captures an image of a front surface of the substrate W.

FIG. 4 illustrates an example of a transfer trajectory 300 of the reference position (central position) of the substrate W. As the substrate W is transferred along the transfer trajectory 300, the substrate W and the fork 151 pass between the lower line camera 171 and the upper line camera 172 so that an image of a region indicated by a capturing range 400 is captured.

The pedestal 173 is provided on the base plate 175 and is capable of not only placing the substrate W thereon but also rotating the placed substrate W. The alignment sensor 174 detects a peripheral end of the substrate W. Here, a notch indicating a crystal orientation is formed in the periphery of the substrate W. When the aligner module 170 rotates the substrate W placed on the pedestal 173 once, the alignment sensor 174 may detect a position of the notch in the substrate W by detecting the peripheral end of the substrate W. Further, the aligner module 170 may adjust the position of the notch in the substrate W by rotating the substrate W placed on the pedestal 173 so that the detected position of the notch is arranged in a predetermined direction.

<Capturing process on Substrate W>

Figure 5:
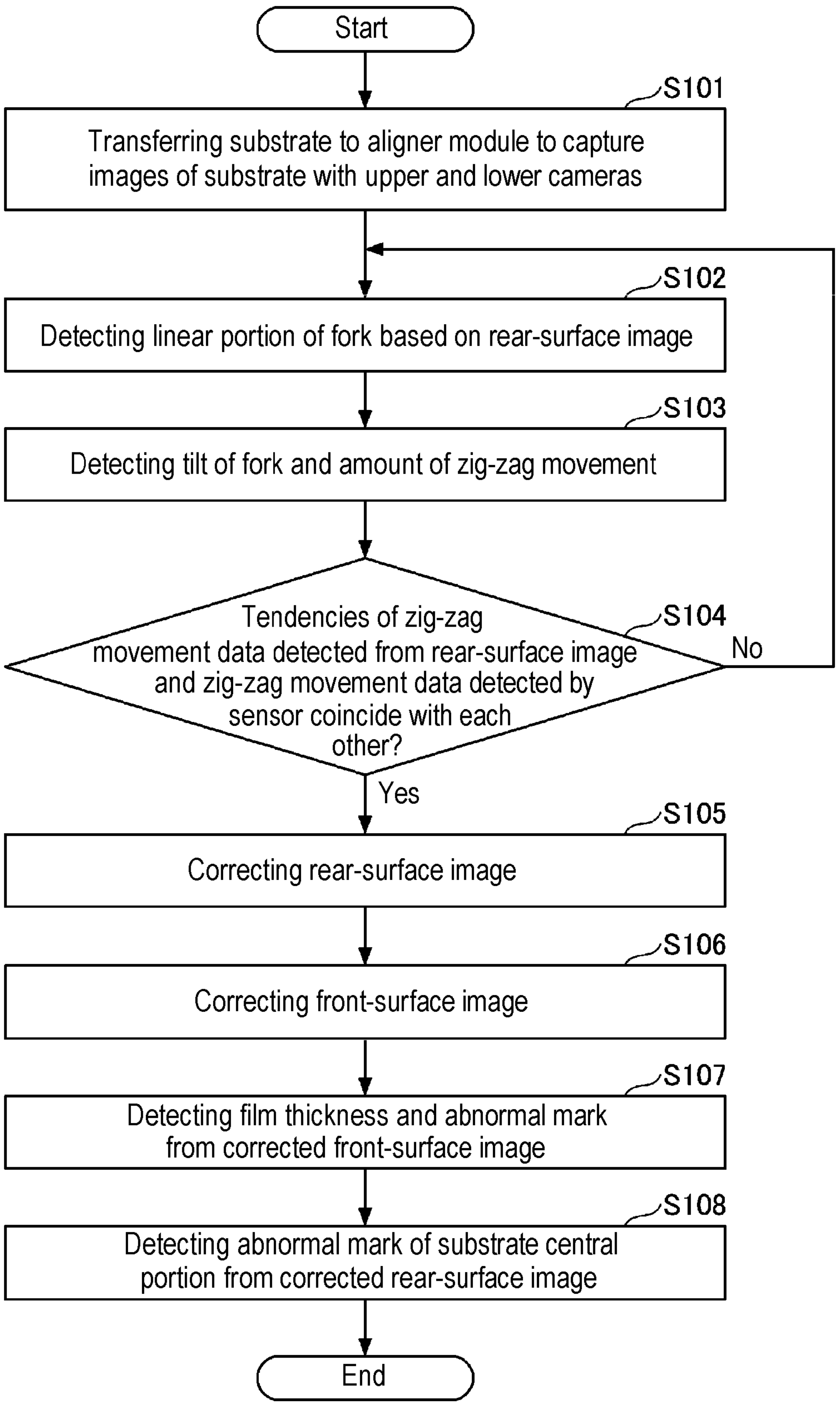
FIG. 5 is a flowchart illustrating an example of a substrate capturing process.

Next, a capturing process on the substrate W will be described with reference to FIGS. 5 to 9. FIG. 5 is a flowchart illustrating an example of the capturing process on the substrate W.

In step S101, the controller 180 controls the atmospheric-side transfer device 150 to transfer the substrate W held by the fork 151 to the pedestal 173 of the aligner module 170. Further, the controller 180 controls the lower line camera 171 and the upper line camera 172 to capture images of the substrate W being transferred and the fork 151. The controller 180 generates a rear-surface image based on the image captured by the lower line camera 171. Further, the controller 180 generates a front-surface image based on the image captured by the upper line camera 172. Further, the controller 180 detects the transfer trajectory (zig-zag movement data) of the reference position (central position) of the substrate W based on the operation of the fork 151 detected by the sensor 155 during the transfer of the substrate W.

Figure 6:
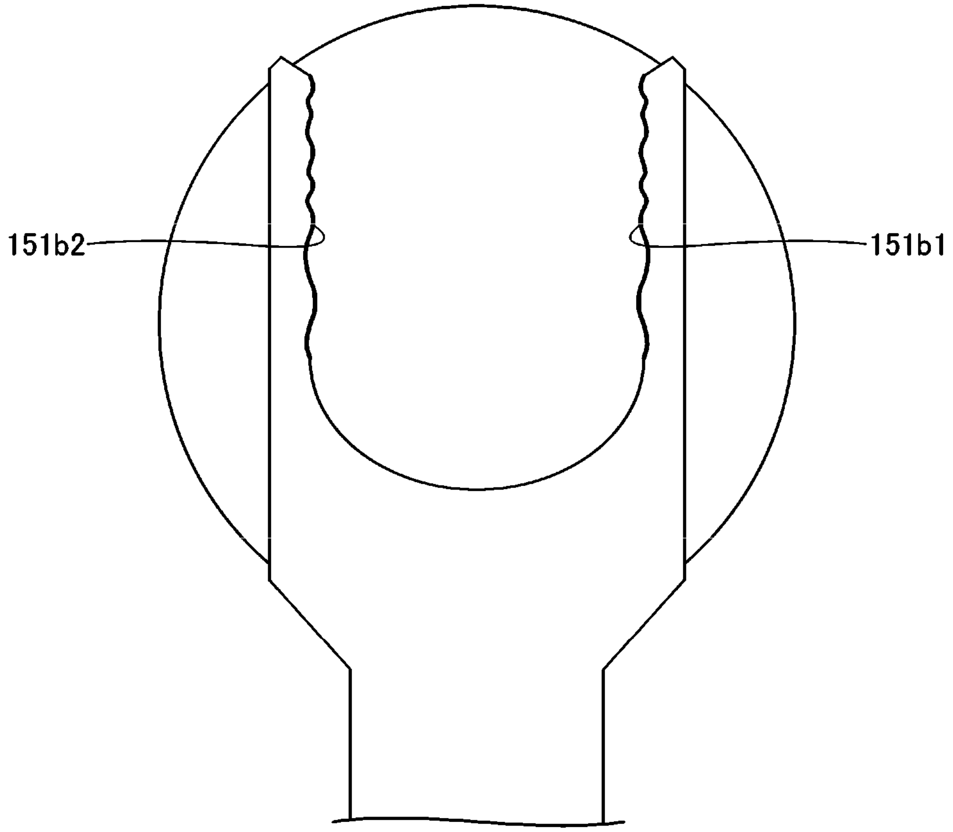
FIG. 6 is a view illustrating an example of a rear-surface image from which a linear portion is detected.

In step S102, the controller 180 detects the linear portions **151*b*1 and 151*b*2 of the fork 151 by an image processing based on the rear-surface image captured by the lower line camera 171. Here, the controller 180 detects a shape of the fork 151 by, for example, an image processing such as binarizing the rear-surface image to detect an edge of the fork 151. Then, the controller 180 detects (extracts) certain portions corresponding to the linear portions 151*b*1 and 151*b*2 from the detected shape of the fork 151. FIG. 6 illustrates an example of the rear-surface image from which the linear portions 151*b*1 and 151*b*2 are detected. Here, when transferring the substrate W by the atmospheric-side transfer device 150, the transfer trajectory of the substrate W may move in a zig-zag pattern due to, e.g., warpage or loose of the multi-joint robot, thus causing blurs in the images captured by the lower line camera 171 and the upper line camera 172. Therefore, the linear portions 151*b*1 and 151*b*2** detected from the rear-surface image exhibit a shape that moves in the zig-zag pattern.

In step S103, the controller 180 detects a tilt of the fork 151 and an amount of zig-zag movement in the transfer trajectory by the image processing from the detected shape of the linear portions **151*b*1 and 151*b*2 of the fork 151. Here, for example, the controller 180 fits a straight line to the linear portions 151*b*1 and 151*b*2, which are moved in the zig-zag pattern, and detects the tilt of the fork 151 from a tilt of the fitted straight line. Further, for example, the controller 180 detects the amount of zig-zag movement in the transfer trajectory based on the amount of zig-zag movement of the linear portions 151*b*1 and 151*b*2. In this way, the controller 180 detects the transfer trajectory exhibiting the zig-zag movement (zig-zag movement data) by the image processing illustrated in steps S102 and step S103 based on the rear-surface image captured in step S101**.

In step S104, the controller 180 compares the zig-zag movement data detected based on the rear-surface image in step S103 with the zig-zag movement data detected by the sensor 155 in step S101, and determines whether tendencies of two pieces of zig-zag movement data coincide with each other. When it is determined that the tendencies coincide with each other (YES in S104), the process of the controller 180 proceeds to step S105. When it is determined that the tendencies do not coincide with each other (NO in S104), the process of the controller 180 returns to step S102 where the image processing illustrated in steps S102 and S103 are repeated).

In step S105, the controller 180 corrects the rear-surface image by the image processing based on the tilt of the fork 151 and the amount of zig-zag movement in the transfer trajectory (zig-zag movement data) detected in step S103.

Figure 7:
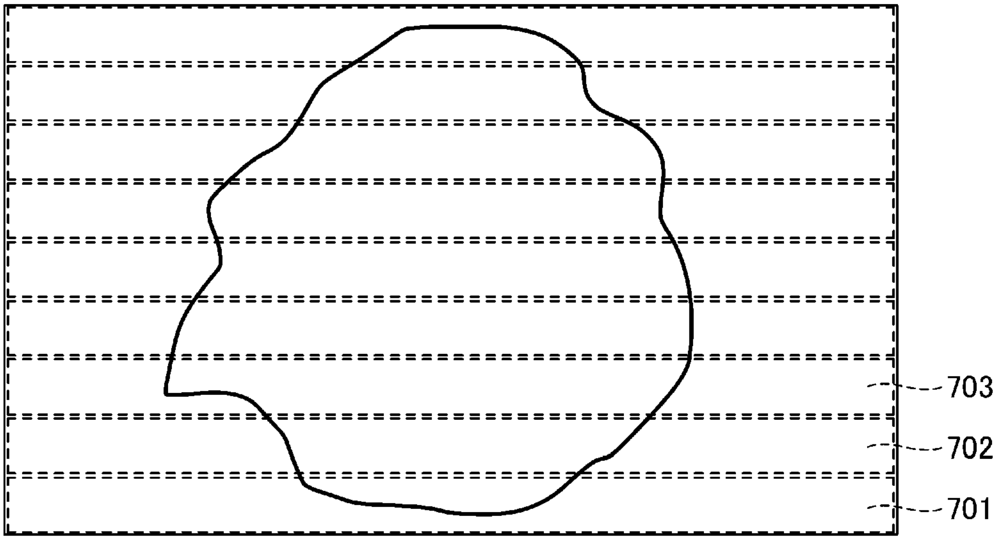
FIG. 7 is a schematic view illustrating an example of an image before correction.

FIG. 7 is a schematic view illustrating an example of the rear-surface image before correction. The rear-surface image before correction (the image captured in step S101) is formed by arranging images 701, 702, 703, . . . , and the like in a widthwise direction (left-right direction in FIG. 7) captured by the lower line camera 171, in the transfer direction of the substrate W (the traveling direction of the fork 151 or an upward direction in FIG. 7).

Figure 8:
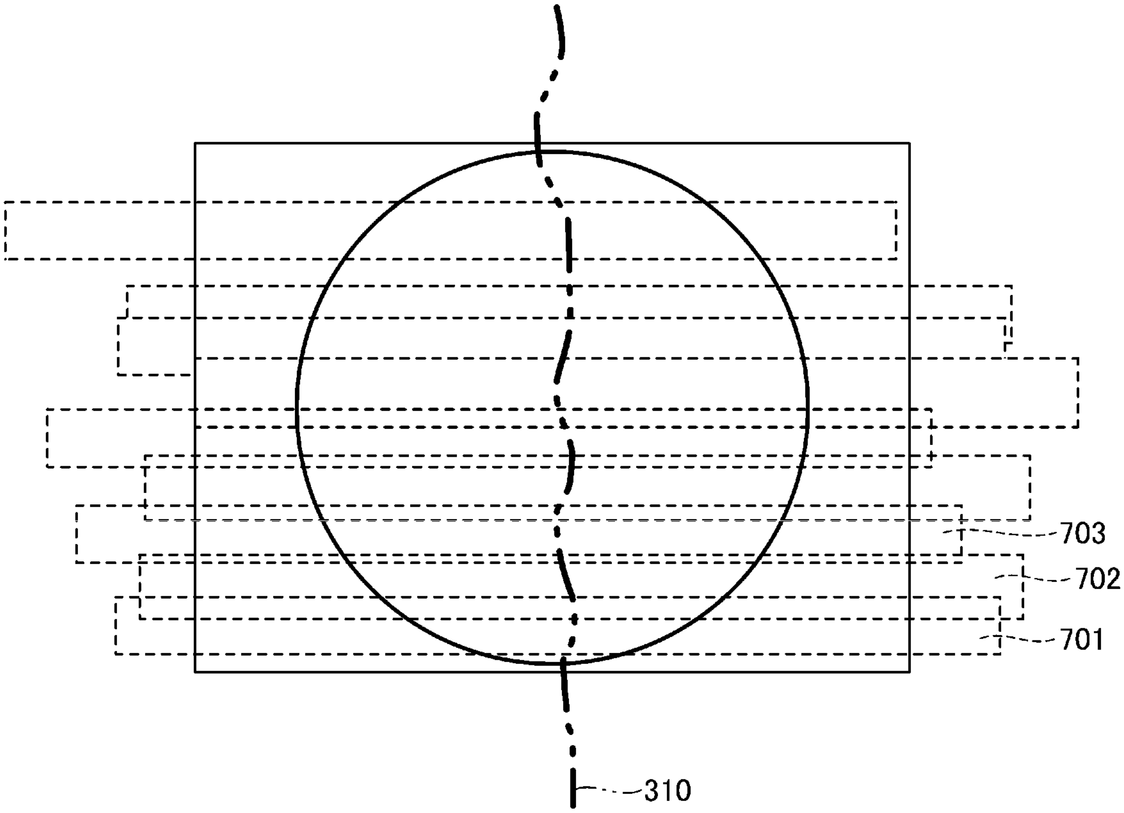
FIG. 8 is a schematic view illustrating an example of an image after correction.

FIG. 8 is a schematic view illustrating an example of a rear-surface image after correction. The controller 180 adjusts a central position of the image 701 in the left-right direction based on the blur of the transfer trajectory 310 in the left-right direction detected in step S103. Further, the controller 180 adjusts a central position of the image 701 in a vertical direction based on a movement distance of the transfer trajectory 310 in the transfer direction detected in step S103. Then, the controller 180 adjusts the arrangements of the images 702, 703, . . . , and the like in the left-right direction and the vertical direction in a similar manner.

Figure 9:
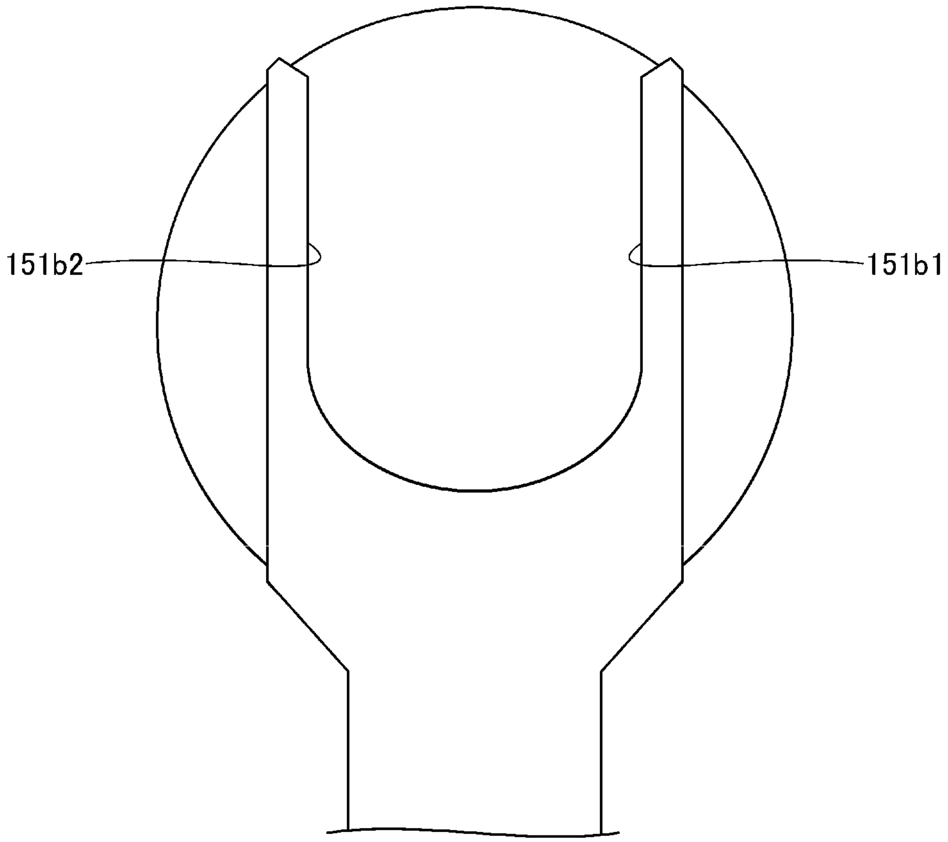
FIG. 9 is a view illustrating an example of the rear-surface image after correction.

FIG. 9 illustrates an example of the rear-surface image after correction. As illustrated in FIG. 9, the linear portions **151*b*1 and 151*b*2 of the fork 151** are corrected to have a linear vertical shape.

In step S106, the controller 180 corrects the front-surface image by the image processing based on the tilt of the fork 151 and the amount of zig-zag movement in the transfer trajectory (zig-zag movement data) detected in step S103.

In step S107, the controller 180 detects a thickness of a thin film formed on the front surface of the substrate W and abnormal marks formed on the front surface of the substrate W based on the corrected front-surface image obtained in step S106.

Here, in the substrate processing described above, the thin film is formed on the front surface of the substrate W. Light reflected at an upper surface of the thin film and light reflected at a lower surface of the thin film interfere with each other, which causes a change in color depending on the thickness of the thin film. The controller 180 stores information obtained by associating the color (e.g., RGB values) with the film thickness by allowing the atmospheric-side transfer device 150 to transfer the substrate W having a known film thickness to the aligner module 170 and allowing the upper line camera 172 to capture an image of the substrate W in advance. The controller 180 detects the film thickness based on the color (e.g., RGB values) of the corrected front-surface image, the information obtained by associating the color with the film thickness. Further, the controller 180 detects a distribution of the film thickness based on a change in the color of the corrected front-surface image.

Further, in a case where an image of the substrate W is captured with a camera that captures an image of the entire surface of the substrate W, a difference in light amount occurs between the central portion and the periphery of the substrate W. This makes it difficult to detect the film thickness based on the color (e.g., RGB values). In contrast, when capturing an image of the substrate W with the upper line camera 172, no difference in light amount occurs between the central portion and the periphery of the substrate W. This makes it possible to properly detect the film thickness.

Further, in a case where an abnormal discharge occurs in the substrate processing described above, the discharge marks are formed on the front surface of the substrate W. The controller 180 may detect a shape of the discharge marks with high precision by using the corrected front-surface image, thus improving a detection accuracy of the discharge marks.

In step S108, the controller 180 detects abnormal marks formed on the central portion of the rear surface of the substrate W from the corrected rear-surface image obtained in step S105.

Here, in the substrate processing described above, the substrate W is adsorbed to, for example, an electrostatic chuck having an annular seal band. Therefore, the substrate W adsorbed to the electrostatic chuck is brought into close contact with the seal band of the electrostatic chuck at an outer peripheral portion of the substrate W. On the other hand, the central portion of the substrate W may float upward from the electrostatic chuck. When the central portion of the substrate W floats upward from the electrostatic chuck, abnormal discharge may occur between the rear surface of the substrate W and the electrostatic chuck. To address this, the controller 180 may properly detect the abnormal marks formed on the central portion of the rear surface of the substrate W by using the corrected rear-surface image.

As described above, according to the substrate transfer system of one embodiment, it is possible to capture the image of the substrate W with high precision by the image correction. This makes it possible to detect the thickness of the film formed on the front surface of the substrate W with high precision. Further, it is possible to detect the discharge marks formed on the front surface of the substrate W with high precision. Further, it is possible to detect the discharge marks formed on the central portion of the rear surface of the substrate W with high precision.

Further, the lower line camera 171 and the upper line camera 172 are provided in the transfer path of the substrate W. This makes it possible to prevent a decrease in throughput of the substrate transfer system. Further, by providing the lower line camera 171 and the upper line camera 172 in the transfer path of the substrate W, it is possible to prevent an increase in footprint of the substrate transfer system 100.

Further, when an abnormality (e.g., the generation of discharge marks or abnormality in film thickness distribution) occurs in the substrate W, the substrate W may not be subjected to a subsequent process. For example, when transferring the substrate W picked up from the FOUP to the aligner module 170, whether or not an abnormality occurs in the substrate W is determined according to the flow illustrated in FIG. 5. When the substrate W is determined to be normal, the position of the notch in the substrate W is aligned, and then the substrate W is transferred to the load lock chamber 130. Thereafter, the substrate W is subjected to the substrate processing in the processing chamber 110. On the other hand, when the substrate W is determined to be abnormal, the substrate W may be returned to the FOUP rather than being transferred to the load lock chamber 130.

Further, the case where the front-surface image and the rear-surface image of the substrate W which is picked up from the FOUP and transferred to the aligner module 170 (substrate W which has not been subjected to the substrate processing in the processing chamber 110) has been described by way of example, but the present disclosure is not limited thereto. A front-surface image and a rear-surface image of the substrate W which has been subjected to the substrate processing in the processing chamber 110 may be captured through the aligner module 170 while the substrate W is being transferred from the load lock chamber 130 to the FOUP.

Further, a position of a cutout such as a notch formed in the periphery of the substrate W may be detected based on the corrected front-surface image. Thus, it is possible to detect the position of the cutout before placing the substrate W on the pedestal 173. Accordingly, it is possible to shorten the time required for aligning the orientation of the substrate W in the aligner module 170. This enhances the throughput of the substrate transfer system. Further, the alignment sensor 174 may be omitted.

Further, the lower line camera 171 and the upper line camera 172 have been described as provided in the aligner module 170, specifically, in the transfer path along which the substrate W is transferred to the pedestal 173 of the aligner module 170, but the present disclosure is not limited thereto. The lower line camera 171 and the upper line camera 172 may be provided in other transfer paths of the substrate W. Further, the lower line camera 171 and the upper line camera 172 may be provided in a transfer path in an ambient environment. This makes it possible to easily install the lower line camera 171 and the upper line camera 172.

In addition, the lower line camera 171 and the upper line camera 172 may be provided in a transfer path in a vacuum atmosphere. For example, in a substrate transfer system including a first vacuum-side transfer chamber connected to a first processing chamber, a second vacuum-side transfer chamber connected to a second processing chamber, and a pass module that connects the first vacuum-side transfer chamber and the second vacuum-side transfer chamber, the lower line camera 171 and the upper line camera 172 may be provided in the pass module. Thus, in a configuration in which a first processing is performed on the substrate W in the first processing chamber and a second processing is performed on the substrate W in the second processing chamber, an image of the substrate W after the first processing may be captured with high precision.

Although the substrate transfer system 100 has been described above, the present disclosure is not limited to the above-described embodiment and the like, and various modifications and improvements are possible within the scope of the gist of the present disclosure described in the claims.

According to one aspect, the present disclosure provides a substrate transfer system and an image correction method that are capable of capturing images of a substrate with high precision.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transfer system comprising:

a transfer device including a substrate holder configured to hold a substrate;

a lower line camera provided in a transfer path of the substrate to capture an image of a rear surface of the substrate which is being transferred and an image of the substrate holder;

an upper line camera provided in the transfer path of the substrate to capture an image of a front surface of the substrate which is being transferred; and a controller that generates a rear-surface image based on the image captured by the lower line camera and generates a front-surface image based on the image captured by the upper line camera, wherein the substrate holder has a linear portion that extends in a transfer direction of the substrate, wherein the controller is configured to:

detect the linear portion of the substrate holder from the rear-surface image; and detect a tilt of the substrate holder and a first amount of zig-zag movement in a transfer trajectory of the substrate from a shape of the detected linear portion of the rear-surface image, and wherein the controller is configured to correct the front-surface image based on the tilt of the substrate holder and the first amount of zig-zag movement in the transfer trajectory of the substrate.

2. The substrate transfer system of claim 1, wherein the controller is configured to correct the rear-surface image based on the tilt of the substrate holder and the first amount of zig-zag movement in the transfer trajectory of the substrate.

3. The substrate transfer system of claim 1, wherein the controller is configured to detect a thickness of a film formed on the front surface of the substrate based on the corrected front-surface image.

4. The substrate transfer system of claim 1, wherein the controller is configured to detect a discharge mark formed on the front surface of the substrate based on the corrected front-surface image.

5. The substrate transfer system of claim 2, wherein the controller is configured to detect a discharge mark formed on a central portion of the rear surface of the substrate based on the corrected rear-surface image.

6. The substrate transfer system of claim 5, wherein the transfer device includes a motion detector configured to detect a motion of the substrate holder, and wherein the controller is configured to compare a second amount of zig-zag movement in the transfer trajectory of the substrate detected by the motion detector with the first amount of zig-zag movement in the transfer trajectory detected from the rear-surface image, and determine whether or not tendencies of the second amount of zig-zag movement and the first amount of zig-zag movement coincide with each other.

7. The substrate transfer system of claim 5, wherein the lower line camera and the upper line camera include a plurality of detection elements arranged in a direction crossing the transfer path.

8. The substrate transfer system of claim 5, wherein the substrate holder includes:

a base portion; and two extension portions extending from the base portion.

9. The substrate transfer system of claim 5, wherein the transfer path is provided in an ambient environment.

10. A substrate transfer system comprising:

a transfer device including a substrate holder configured to hold a substrate;

a lower line camera provided in a transfer path of the substrate to capture an image of a rear surface of the substrate which is being transferred and an image of the substrate holder;

an upper line camera provided in the transfer path of the substrate to capture an image of a front surface of the substrate which is being transferred; and a controller that generates a rear-surface image based on the image captured by the lower line camera and generates a front-surface image based on the image captured by the upper line camera, wherein the substrate holder has a linear portion that extends in a transfer direction of the substrate, wherein the controller is configured to:

detect the linear portion of the substrate holder from the rear-surface image; and detect a tilt of the substrate holder and a first amount of zig-zag movement in a transfer trajectory of the substrate from a shape of the detected linear portion of the rear-surface image, wherein the transfer device includes a motion detector configured to detect a motion of the substrate holder, and wherein the controller is configured to compare a second amount of zig-zag movement in the transfer trajectory of the substrate detected by the motion detector with the first amount of zig-zag movement in the transfer trajectory detected from the rear-surface image, and determine whether or not tendencies of the second amount of zig-zag movement and the first amount of zig-zag movement coincide with each other.

11. The substrate transfer system of claim 1, wherein the lower line camera and the upper line camera include a plurality of detection elements arranged in a direction crossing the transfer path.

12. The substrate transfer system of claim 1, wherein the substrate holder includes:

a base portion; and two extension portions extending from the base portion.

13. The substrate transfer system of claim 1, wherein the transfer path is provided in an ambient environment.

* * * * *